(12) United States Patent
Vinson et al.

(10) Patent No.: US 7,755,889 B2
(45) Date of Patent: Jul. 13, 2010

(54) AIR MANIFOLD FOR ELECTRONIC MODULE ENCLOSURE

(75) Inventors: Wade D. Vinson, Magnolia, TX (US); David W. Sherrod, Tomball, TX (US); David W. Deis, Spring, TX (US); Steve Novack, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/138,186

(22) Filed: Jun. 12, 2008

(65) Prior Publication Data

US 2008/0316704 A1 Dec. 25, 2008

Related U.S. Application Data

(60) Provisional application No. 60/943,977, filed on Jun. 14, 2007, provisional application No. 60/943,426, filed on Jun. 12, 2007.

(51) Int. Cl.
G06F 1/20 (2006.01)
H05K 7/20 (2006.01)
H05K 5/00 (2006.01)

(52) U.S. Cl. ............... 361/679.49; 361/679.48; 361/679.5; 361/692; 361/694; 361/695; 312/223.2; 312/236; 454/184

(58) Field of Classification Search ............ 361/679.46, 361/679.48–679.5, 690, 694–695, 715–716; 165/80.3; 174/16.1; 312/236; 454/184
See application file for complete search history.

(56) References Cited

U.S. PATENT DOCUMENTS

| 5,210,680 | A | 5/1993 | Scheibler |
| 5,247,427 | A * | 9/1993 | Driscoll et al. ......... 361/679.39 |
| 5,475,562 | A | 12/1995 | Gow |
| 5,570,270 | A | 10/1996 | Naedel et al. |
| 5,586,865 | A | 12/1996 | Yin |
| 5,813,243 | A | 9/1998 | Johnson et al. |
| 6,115,251 | A | 9/2000 | Patel et al. |
| 6,587,340 | B2 * | 7/2003 | Grouell et al. ............... 361/695 |
| 6,690,575 | B1 | 2/2004 | Banton et al. |
| 6,771,499 | B2 * | 8/2004 | Crippen et al. ......... 361/679.48 |
| 6,927,975 | B2 * | 8/2005 | Crippen et al. ......... 361/679.49 |
| 6,961,242 | B2 | 11/2005 | Espinoza-Ibarra |
| 7,139,170 | B2 * | 11/2006 | Chikusa et al. ............. 361/695 |
| 7,344,439 | B2 * | 3/2008 | Henry et al. ................. 454/184 |
| 7,549,917 | B2 * | 6/2009 | Henry et al. ................. 454/184 |
| 7,554,803 | B2 * | 6/2009 | Artman et al. ............... 361/695 |
| 2002/0122297 | A1 | 9/2002 | Dong |
| 2004/0125561 | A1 | 7/2004 | Gwin et al. |
| 2004/0264128 | A1 | 12/2004 | Crippen et al. |
| 2005/0141197 | A1 | 6/2005 | Erturk et al. |
| 2006/0087814 | A1 | 4/2006 | Brandon et al. |

OTHER PUBLICATIONS

Babcock, R. F., "Fault-Tolerant Cooling of Multiple Parallel Processor Modules", IBM Technical Disclosure Bulletin, vol. 39, No. 05, May 1996, pp. 171-172.*

* cited by examiner

Primary Examiner—Jayprakash N Gandhi
Assistant Examiner—Robert J Hoffberg

(57) ABSTRACT

A central air manifold for an electronic module enclosure includes a front section and a rear section. The front section includes openings adapted to communicate with electronic modules and the rear section includes openings adapted to communicate with fans. The openings of the front section can be open when electronic modules are installed in the front section and the openings in the rear section can be open when operating fans are installed in the rear section.

20 Claims, 6 Drawing Sheets

AIR MANIFOLD FOR ELECTRONIC MODULE ENCLOSURE

CROSS-REFERENCE TO RELATED APPLICATIONS

This Utility patent application is based on and claims the benefit of U.S. Provisional Application No. 60/943,426, filed on Jun. 12, 2007, and U.S. Provisional Application No. 60/943,977, filed on Jun. 14, 2007, the contents of which are both hereby incorporated by reference in their entirety.

BACKGROUND

Server enclosures can be designed to be customizable such that an enclosure can support different numbers and types of electrical components to be housed within the enclosure. If an enclosure is not to full capacity, the enclosure may include one or more unoccupied compartments utilized to store server components, such as blade servers, storage servers, switches, onboard administrative modules, fans, etc. As components are removed and/or replaced from the server enclosure, improper airflow within the enclosure can be created. Improper airflow within a server enclosure can result in overheating and/or failure of components within the enclosure.

DETAILED DESCRIPTION

In the following detailed description, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
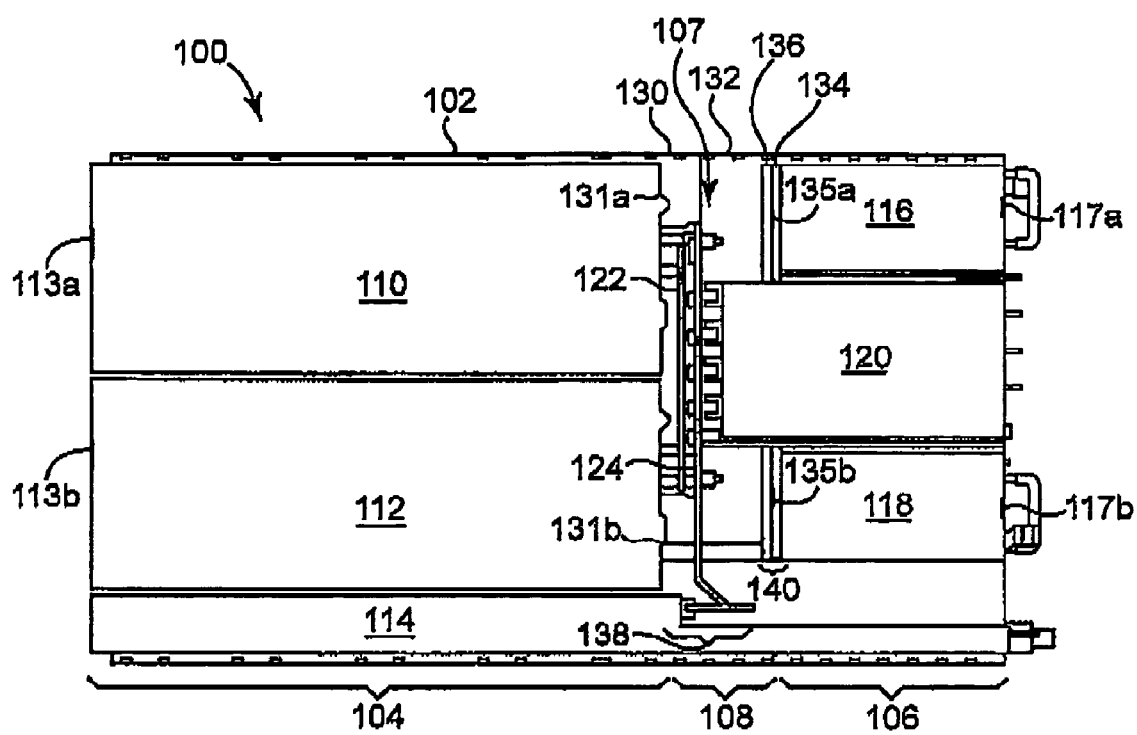
FIG. 1 is a schematic view of one embodiment of a server enclosure.

FIG. 1 is a schematic view of one embodiment of a server enclosure 100 that includes a chassis 102. Chassis 102 includes a plurality of sections for housing components therein. Any number of components, as described below, such as electronic modules and air movers can be positioned within chassis 102. In one embodiment, chassis 102 includes a front region 104, a rear region 106 and a central manifold 107 that forms an air chamber or central plenum 108 positioned between the front region 104 and the rear region 106. In one embodiment, manifold 107 can be designed to be relatively air tight to maintain proper airflow within chassis 102.

In one embodiment, front region 104 is adapted to house a plurality of electronic modules (e.g., server, blades, storage blades, optical drivers) for example, in upper and lower server compartments 110 and 112. Front region 104 is also adapted to house a plurality of power supply modules in section 114. In one embodiment, rear region 106 is adapted to house a plurality of fans in sections 116 and 118 as well as a plurality of interconnect and/or onboard administration modules in section 120. Fans in sections 116 and 118 operate to bring air through airflow openings in a front of chassis 102 (e.g., airflow inlets 113a and 113b) and force air through airflow outlets in a rear of chassis 102 (e.g., airflow outlets 117a and 117b).

In one embodiment, a signal midplane 122 is provided to transmit signals between server blades in front region 104 and the interconnect and onboard administrator modules in section 120. In one embodiment, a power back plane 124 is provided to distribute power from the power supply modules in section 114 to components within enclosure 100.

In one embodiment, central manifold 107 includes a front section 130, a middle section 132 and a rear section 134. Front section 130 includes a plurality of openings (e.g., 131a and 131b) into which servers seal when in use. If a server is not installed in a particular compartment in front region 104, a sealing mechanism such as a gate seals off central plenum 108 from the particular compartment in front region 104. Middle section 132 wraps around the signal midplane 122 and power back plane 124 and includes walls to transfer air flow from front region 104 to rear region 106. Rear section 134 includes a plurality of openings (e.g., airflow openings 135a and 135b) into which the fans seal when in use. Rear section 134 also includes a plurality of air backflow prevention members 136 that move to a closed position when a fan is not installed or when the fan does not rotate. The plurality of air backflow prevention members form sealing mechanisms to central plenum 108.

In one embodiment, a front transition region 138 in front section 130 joins servers in bays 110 and 112 with central plenum 108. Additionally, rear section 134 and air backflow prevention members 136 form a rear transition region 140 from plenum 108 to rear region 106.

Figure 2:
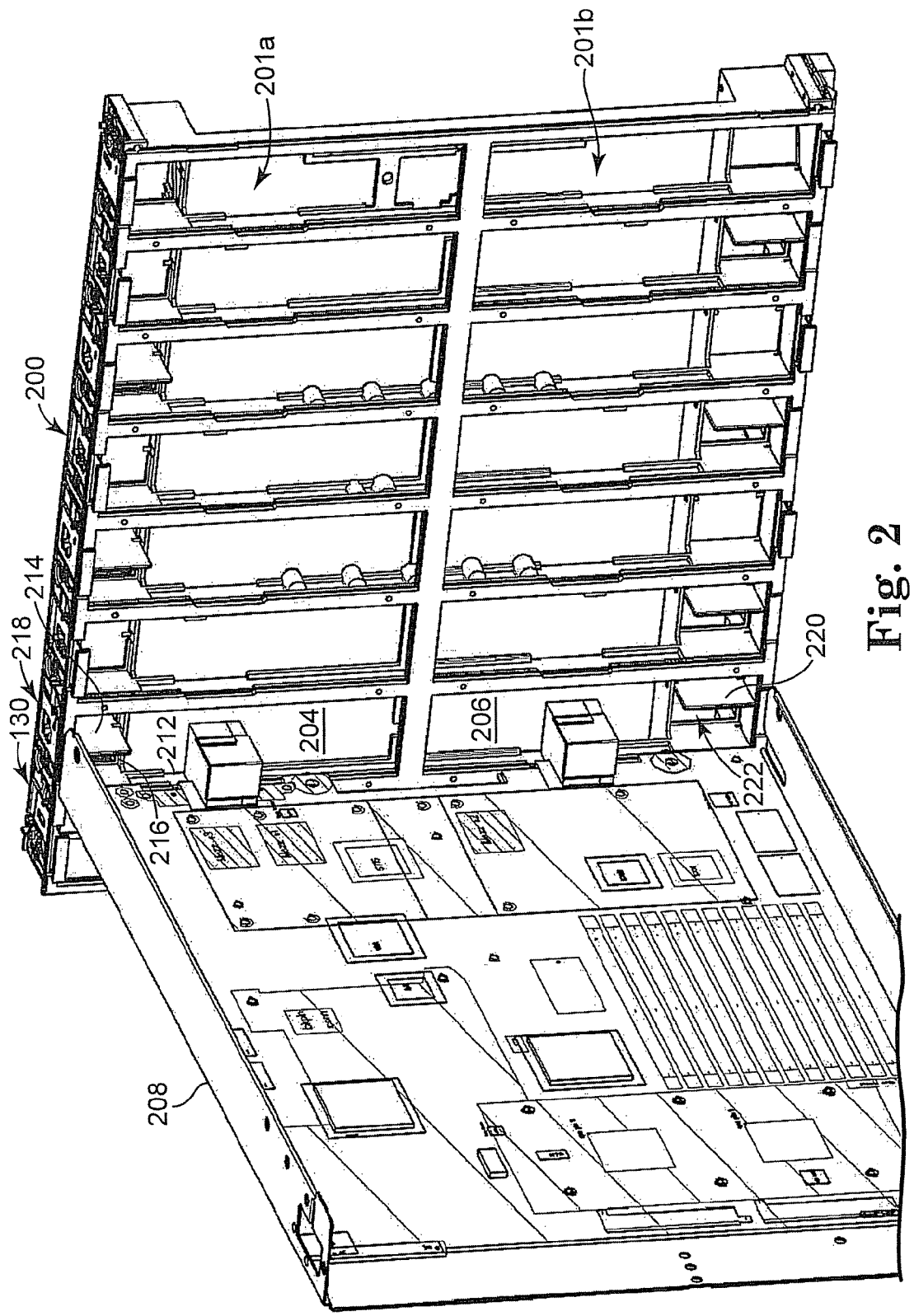
FIG. 2 is a front isometric view of one embodiment of a server engaged with one embodiment of a frame.

FIG. 2 is an isometric front view of one embodiment of front section 130 a frame forming a seal between servers positioned in compartments 110 and 112 and central plenum 108 (FIG. 1). In one embodiment, frame 200 includes eight upper bays 201a and eight lower bays 201b. On the illustrated embodiment, bay 204 of upper bays 201a and bay 206 of lower bays 201b have received a server 208. Server 208 is known as a full-high server, which occupies both an upper bay and a lower bay, in this case bays 204 and 206. Frame 200 can also receive what is known as half-high servers, which only occupy a single bay. In one embodiment, a sealing portion 212 seals frame 200 against server 208. In one embodiment, sealing portion 212 can include an elastomeric material adapted to compress and form a seal between server 208 and frame 130.

In one embodiment, bay 204 further includes a gate 214 that selectively opens and closes an opening 216 through use of an actuator 218. For example, when server 208 is installed and engaged with frame 200, actuator 218 operates to open gate 214 and allow airflow through openings 216 to server 208. When server 208 is removed, gate 214 closes in order to maintain proper airflow throughout enclosure 100. Bay 206 includes a corresponding actuator (not shown) and gate 220 that selectively opens an opening 222 when a server is installed and closes when a server is removed from bay 206.

Figure 3:
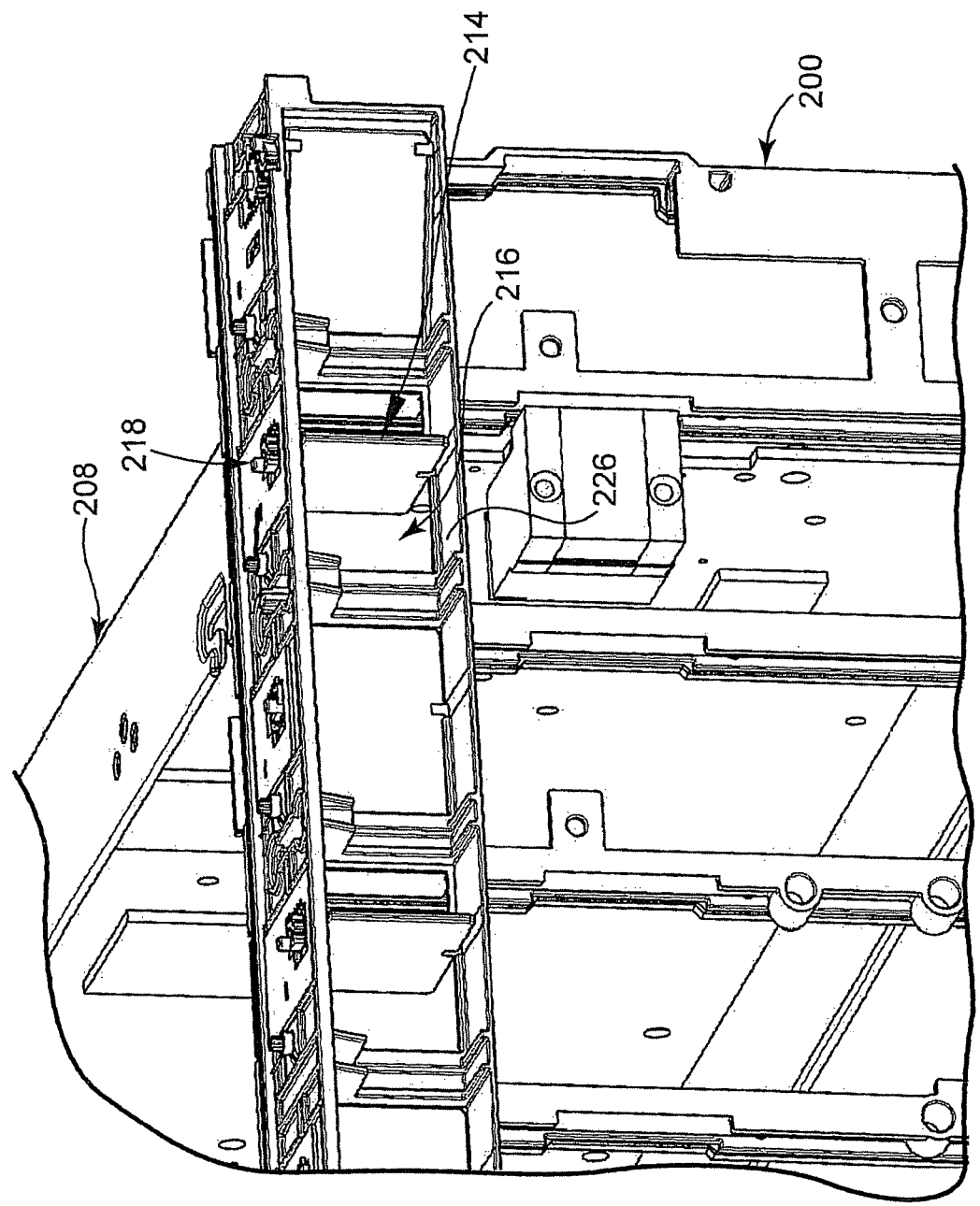
FIG. 3 is a rear isometric view of the server engaged with the frame of FIG. 2.

With particular reference to FIG. 3, in one embodiment, frame 200 includes a transition region 226. Transition region 226 is a part of transition region 138 provided in frame 200 and reduces pressure drop between server 208 and central plenum 108 when server 208 is installed in bay 204 (FIG. 2). Air can transition from server 208 to central plenum 108 and particularly through transition region 226.

Figure 4:
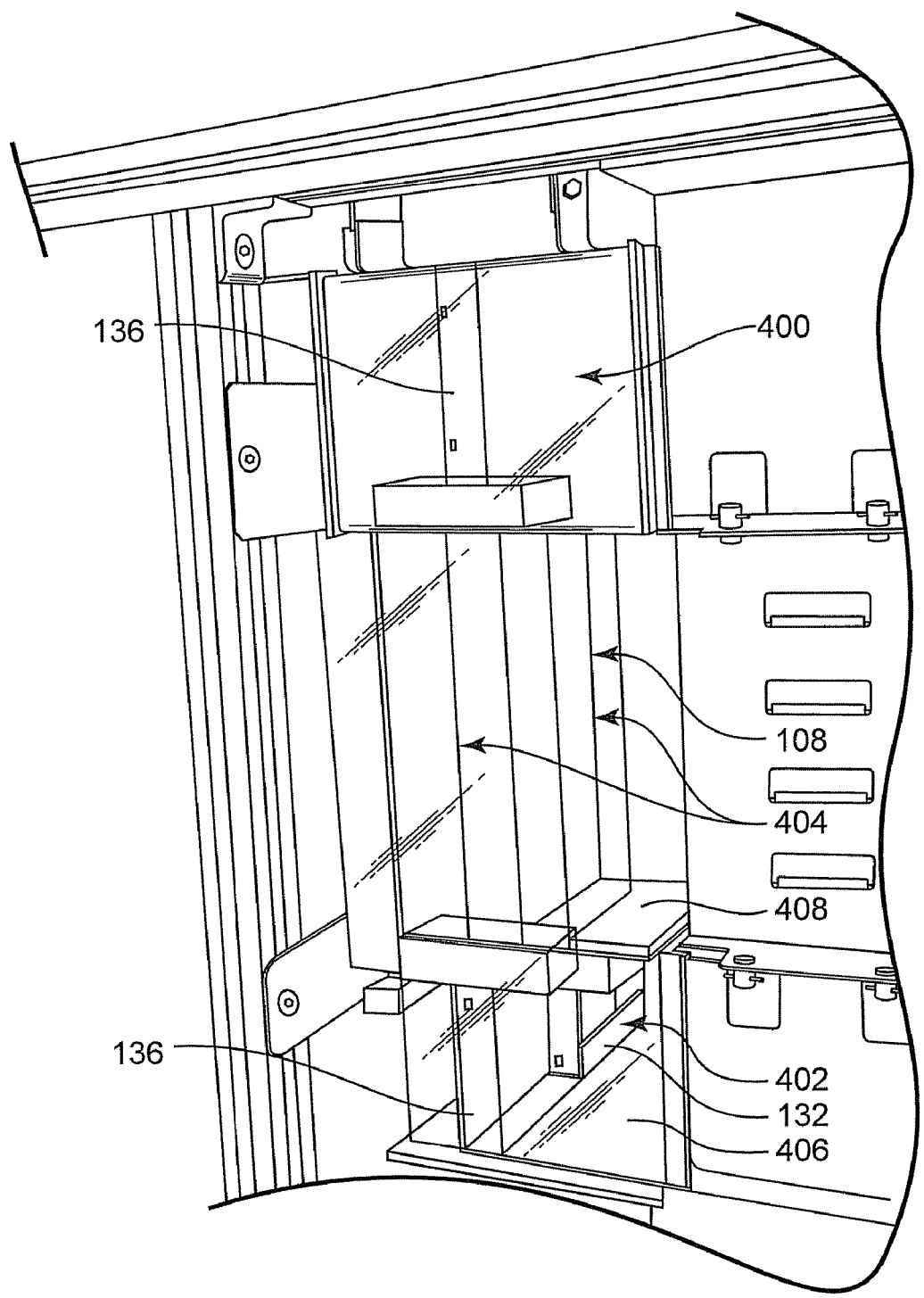
FIG. 4 is a side view of one embodiment of a middle section positioned in the server enclosure of FIG. 1.

FIG. 4 is a side view of one embodiment of middle section 132 positioned within central plenum 108. In the embodiment illustrated, middle section 132 includes an upper surround 400, a lower surround 402 and a plurality of middle supports 404 that bridge the upper surround 400 and the lower surround 404. In one embodiment, lower surround 402 includes a side wall 406 and a transverse wall 408. The lower surround 402 also includes a side wall (not shown) on an opposite side of the chassis 102. Together, the side walls and transverse wall of lower surround 402 direct airflow from servers in lower bays 112 into fans in section 118 (FIG. 1). In one embodiment, upper surround 400 is similarly constructed, including two side walls positioned on opposite sides of chassis 102 and a transverse wall directing airflow from servers in upper bays 110 into fans in section 116 (FIG. 1).

Figure 5:
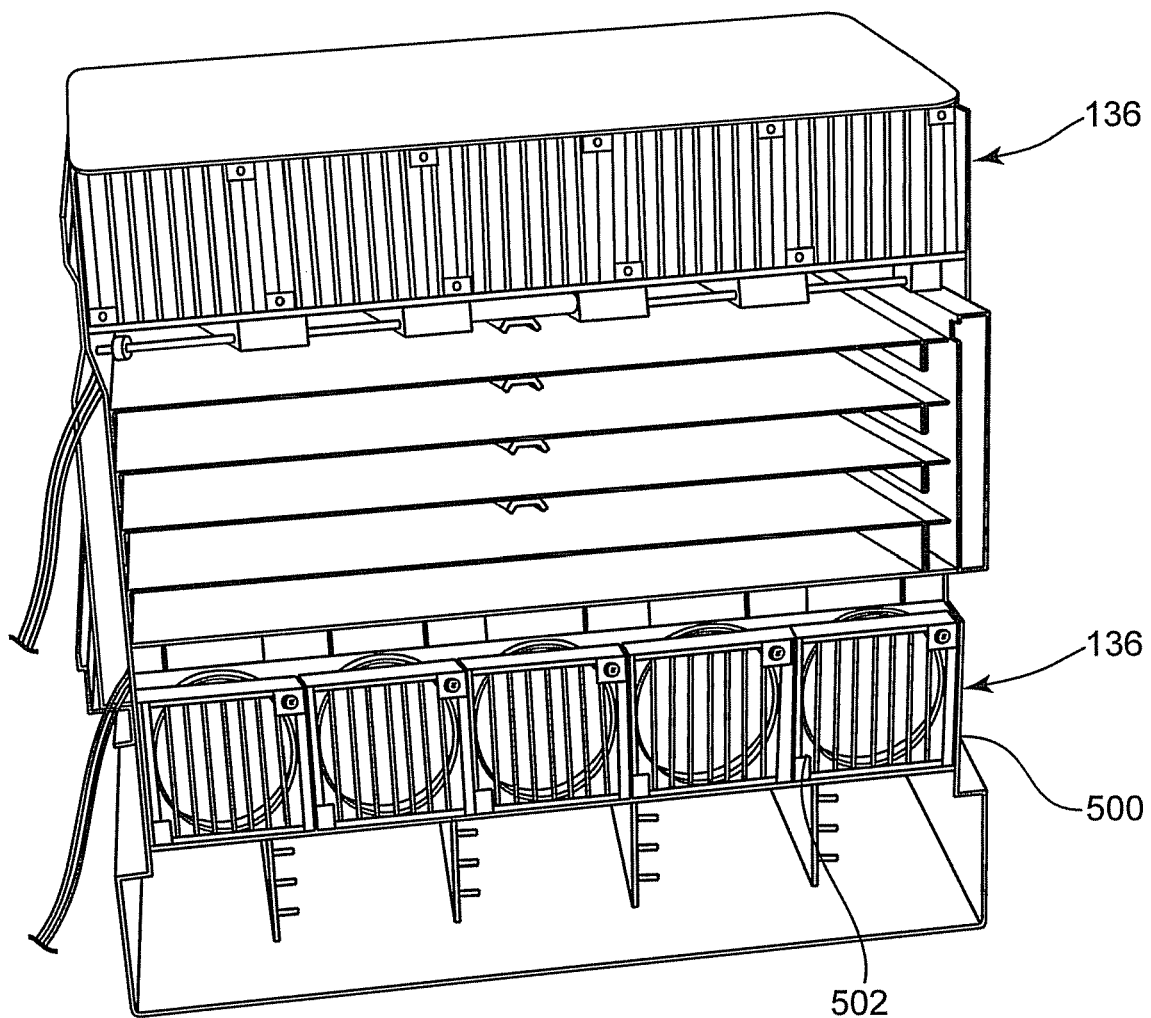
FIG. 5 is a front view of one embodiment of a rear region of the server enclosure of FIG. 1.

FIG. 5 illustrates one embodiment of the plurality of air backflow prevention members 136. In the embodiment illustrated, five upper air backflow prevention members and five lower air backflow prevention members are provided. The air backflow prevention members 136 communicate with fans provided in rear region 106 of chassis 102 (FIG. 1). If a fan associated with the air backflow prevention member is operating, vanes for the air backflow prevention member will be open and allow airflow therethrough. However, if the associated fan is not operating or no fan is installed in an associated bay, the vanes on the air backflow prevention member will be closed. By allowing the vanes to close, proper airflow can be maintained within central plenum 108 and directed to fans that are operational.

In one embodiment, air backflow prevention members 136 also form transition regions, for example transition region 500, from central plenum 108 to rear region 106 (FIG. 1). The transition regions compress air flowing from central plenum 108 into fans in rear region 106. In one embodiment, each of the air backflow prevention members 136 also include a circular plenum, for example plenum 502, that further compresses air and also can be used to form a seal with rear section 134.

Figure 6:
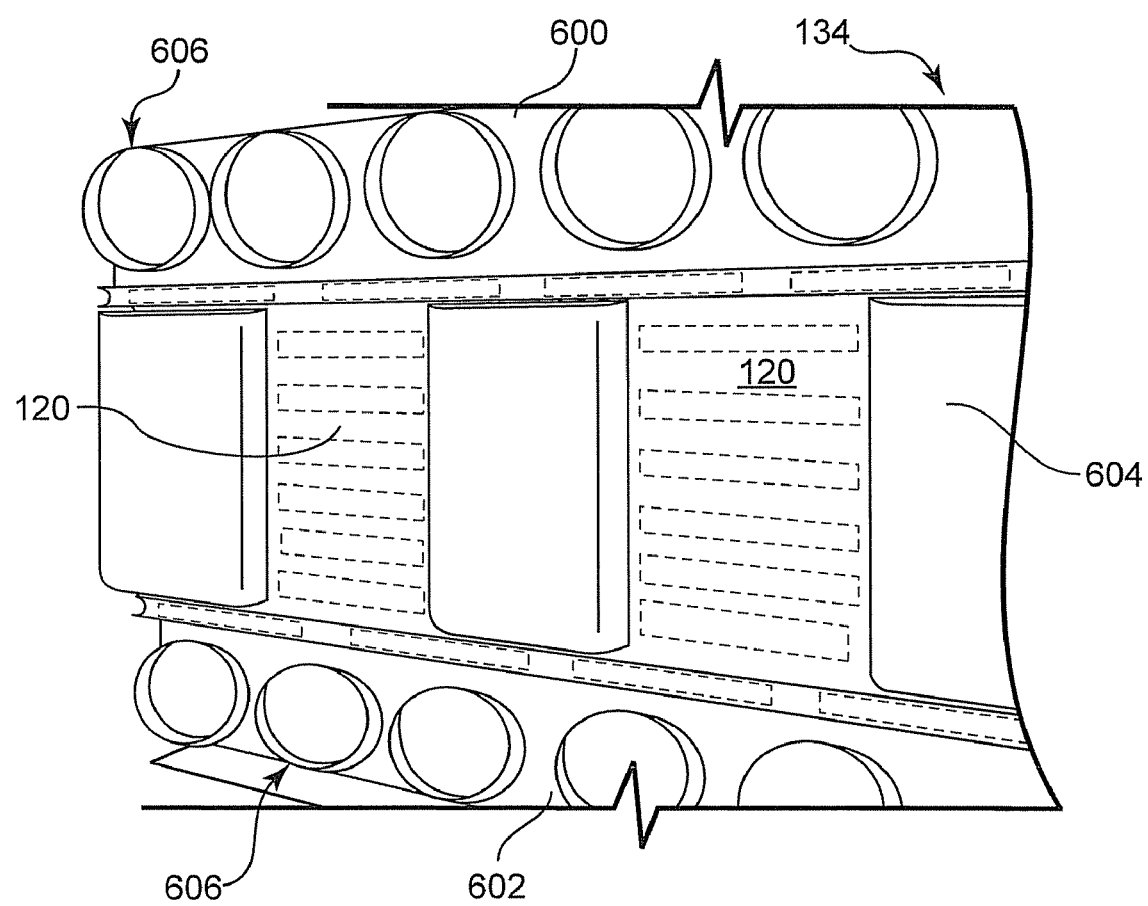
FIG. 6 is a front view of one embodiment of a fan docking collar and a switch docking collar.

FIG. 6 illustrates one embodiment of rear section 134, which includes an upper fan docking collar 600, a lower fan docking collar 602 and a switch docking collar 604. In one embodiment, fan docking collars 600 and 602 include a plurality of cylindrical members 606 that mate with the plurality of air backflow prevention members 136, in particular the circular plenums of the air backflow prevention members 136. The cylindrical members 606 form a seal with the air backflow prevention members 136. In one embodiment, fans can be mounted to the fan docking collars 600 and 602 in order to seal into central chamber 108. In one embodiment, switch docking collar 604 seals around the switch modules 120.

Through use of front section 130, middle section 132 and rear section 134, proper airflow within central plenum 108 can be maintained. Additionally, any number of servers and/or fans can be provided in chassis 102 wherein front section 130 and rear section 134 can selectively allow and prevent airflow therethrough depending on whether a corresponding component is installed in a particular bay. For example, front section 130 can include a number of openings and a gate for each opening such that if a server is engaged with a corresponding bay, the gate will be open and if the server is removed from the bay, the gate will be closed. Additionally, rear section 134 can include a plurality of air backflow prevention members that are open to airflow when an operating fan is coupled thereto and closed when the fan is not operating or removed. Furthermore, middle section 132 can transfer airflow from front section 130 to rear section 134.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. An enclosure for electronic modules, comprising:
    a chassis including:
        a front region adapted to house the electronic modules;
        a rear region adapted to house a plurality of fans; and
        a central manifold positioned in the chassis between the front region and the rear region and including:
            a plenum adapted to transfer airflow from the front region to the rear region;
            a front section having a plurality of front openings each adapted to communicate with one of the electronic modules, the plurality of front openings positioned between the electronic modules and the plenum;
            a front transition region joining the plurality of front openings to the plenum;
            a rear section having a plurality of rear openings each adapted to communicate with one of the fans;
            a rear transition region joining the plurality of rear openings to the plenum;
            a front sealing mechanism positioned in the front section and adapted to selectively seal the plurality of front openings; and
            a rear sealing mechanism adapted to selectively seal the plurality of rear openings.

2. The enclosure of claim 1 wherein the front sealing mechanism includes a plurality of gates to selectively open and close the plurality of front openings.

3. The enclosure of claim 2 wherein the front section includes a plurality of actuators for the plurality of gates, wherein each of the actuators operate to open a corresponding gate when an electronic module is installed in the enclosure.

4. The enclosure of claim 1 wherein the rear sealing mechanism includes a plurality of air backflow prevention members to selectively open and close the plurality of rear openings.

5. The enclosure of claim 1 wherein the front section includes a first bay occupied by a first electronic module and a second section unoccupied by a second electronic module, the first bay being open to airflow from the first electronic module to the plenum and the second bay being closed to airflow from the front region to the plenum.

6. The enclosure of claim 1 wherein the rear region includes a first bay occupied by a fan and a second bay unoccupied by a fan, the first bay being open to airflow from the plenum to the fan and the second bay being closed to airflow from the plenum to the rear region.

7. The enclosure of claim 1 wherein the central manifold includes at least one wall positioned in a direction of airflow for the enclosure to direct air from the plurality of front openings to the plurality of rear openings.

8. The enclosure of claim 1 wherein the front section includes a frame and an elastomeric seal adapted to be positioned between an electronic module and the frame.

9. The enclosure of claim 1 and further comprising:
a middle section positioned between the front section and the rear section, the middle section including an upper surround transferring airflow from an upper portion of the front section to an upper portion of the rear section and a lower surround transferring airflow from a lower portion of front section to a lower portion of the rear section.

10. A central manifold positioned within an electronic module enclosure for transferring air from a front region of the enclosure to a rear region of the enclosure, comprising:
a front section comprising a frame having a plurality of front openings, each front opening including a gate coupled to the frame and movable between an open position and a closed position, the gate being in the open position when an electronic module is communicated with a corresponding one of the front openings;
a rear section spaced from the front section and having a plurality of rear openings, each rear opening including an air backflow prevention member movable between an open position and a closed position, the air backflow prevention member being in the open position when an operating fan is communicated with a corresponding one of the rear openings; and
an air plenum positioned between the front section and the rear section and adapted to transfer air from the front section to the rear section upon communication of the electronic module with the corresponding one of the front openings and communication of the operating fan with the corresponding one of the rear openings, wherein the frame is positioned between the electronic module and the plenum.

11. The central manifold of claim 10 and further comprising:
a middle section positioned between the front section and the rear section, wherein the middle section forms the air plenum with the front section and the rear section.

12. The central manifold of claim 11 wherein the middle section includes an upper surround and a lower surround, the upper surround transferring airflow from a top of the front section to a top of the rear section and the lower surround transferring airflow from a bottom of the front section to a bottom of the rear section.

13. The central manifold of claim 10 wherein the front section includes a transition region joining the plurality of front openings with the air plenum.

14. The central manifold of claim 10 wherein the rear section includes a transition region joining the plurality of rear openings with the air plenum.

15. The central manifold of claim 10 wherein the rear section includes a plurality of cylindrical members to mate with the air backflow prevention members.

16. The central manifold of claim 10 wherein the front section includes an elastomeric seal that is adapted to form a seal between the front section and an electronic module upon communication of the electronic module with the corresponding one of the front openings.

17. A method of controlling airflow in an electronic module enclosure, comprising:
providing a chassis having a front region, a rear region, and an air plenum positioned between the front region and the rear region;
positioning a front section in the chassis between the front region and the plenum, the front section including a plurality of front openings to be aligned with electronic modules in the front region, each front opening including a gate moveable between an open position allowing airflow from the front region to the plenum and a closed position blocking airflow from the front region to the plenum;
positioning a rear section in the chassis between the rear region and the plenum, the rear section including a plurality of rear openings to be aligned with fans in the rear region, each rear opening including an air backflow prevention member movable between an open position allowing airflow from the plenum to the rear region and a closed position blocking airflow from the plenum to the rear region;
communicating an electronic module with one of the front openings such that a corresponding gate moves from the closed position to the open position, the gate being positioned between the electronic module and the plenum; and
communicating a fan with one of the rear openings such that a corresponding air backflow prevention member moves from the closed position to the open position.

18. The method of claim 17 and further comprising:
providing a middle section between the front section and the rear section, the middle section including at least one wall directing airflow from the electronic module to the fan.

19. The method of claim 17 and further comprising:
removing the electronic module from the one of the front openings such that the corresponding gate returns to the closed position.

20. The method of claim 17 and further comprising:
removing the fan from the one of the rear openings such that the corresponding air backflow prevention member returns to the closed position.

* * * * *

UNITED STATES PATENT AND TRADEMARK OFFICE
CERTIFICATE OF CORRECTION

| | | |
|---|---|---|
| PATENT NO. | : 7,755,889 B2 | Page 1 of 1 |
| APPLICATION NO. | : 12/138186 | |
| DATED | : July 13, 2010 | |
| INVENTOR(S) | : Wade D. Vinson et al. | |

It is certified that error appears in the above-identified patent and that said Letters Patent is hereby corrected as shown below:

In column 4, line 55, in Claim 5, delete "section" and insert -- bay --, therefor.

Signed and Sealed this

Twelfth Day of October, 2010

David J. Kappos
*Director of the United States Patent and Trademark Office*